(12) United States Patent
Martins

(10) Patent No.: US 6,580,308 B1
(45) Date of Patent: Jun. 17, 2003

(54) VDS PROTECTION FOR HIGH VOLTAGE SWING APPLICATIONS

(75) Inventor: Marcus M. Martins, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/185,366

(22) Filed: Jun. 27, 2002

(51) Int. Cl.[7] .............................................. H03K 17/04
(52) U.S. Cl. .................................... 327/375; 327/328
(58) Field of Search ................................. 327/375, 376, 327/377, 309, 327, 328, 333, 108, 112, 170, 541, 543, 306; 361/90, 91

(56) References Cited

U.S. PATENT DOCUMENTS

| | | | | |
|---|---|---|---|---|
| 4,750,078 A | * | 6/1988 | Ganger et al. ................. 361/90 |
| 5,036,218 A | * | 7/1991 | Jaquette ....................... 327/375 |
| 5,481,216 A | * | 1/1996 | Yeung ........................ 327/108 |
| 5,546,045 A | * | 8/1996 | Sauer ......................... 327/375 |
| 6,043,701 A | * | 3/2000 | Schrittesser ................. 327/375 |

* cited by examiner

Primary Examiner—Toan Tran
(74) Attorney, Agent, or Firm—W. Daniel Swayze, Jr.; W. James Brady; Frederick J. Telecky, Jr.

(57) ABSTRACT

The invention provides apparatus, methods and systems for providing voltage protection at the drain-to-source path of an output transistor. The invention discloses circuit apparatus and system giving excess voltage protection in a circuit having a voltage swing up to approximately twice the voltage capacity of a circuit output transistor. Methods of the invention disclose maintaining the source-to-drain voltage of a protection transistor coupled to the circuit output transistor below its maximum value, while also maintaining the protection transistor gate-to-source voltage below its maximum value. The drain-to-source voltage of the circuit output transistor is guarded from exceeding its maximum acceptable drain-to-source voltage value by the protection transistor. Also disclosed are methods of selecting a protection transistor and related components such that the bias of the protection transistor is adjusted in response to the circuit output.

22 Claims, 3 Drawing Sheets

VDS PROTECTION FOR HIGH VOLTAGE SWING APPLICATIONS

TECHNICAL FIELD

The present invention relates in general to providing circuit protection from excessive voltage in applications having a high voltage swing. More particularly, the invention relates to providing circuitry capable of providing a voltage swing at the output in excess of the voltage swing tolerated by the individual circuit components. More specifically, the invention enhances cascode topology such that relatively low voltage transistors may be used in a circuit designed for higher voltage applications.

BACKGROUND OF THE INVENTION

It is well known in the semiconductor arts to use transistors for controlling circuit output. Frequently circuits requiring high voltage supplies can tax the limits of a circuit output transistor or other circuit components. In general, to ensure proper circuit operation larger capacity circuit components are used in high voltage applications. For example, a typical milliactuator driver may require a voltage swing of approximately −25 Volts to +25 Volts. The typical solution in such applications is to use transistors capable of withstanding a drain-to-source voltage (VDS) of approximately 50 Volts. In this way the circuit is capable of withstanding the anticipated voltage swings.

Problems arise, however with this traditional solution. Often manufacturing processes affect the ability to select components. Such a problem may arise for example, where a circuit previously designed and manufactured with processes using transistors capable of withstanding 50 Volts is to be implemented using manufacturing processes superior in other respects, but limited to producing transistors capable of withstanding only 30 Volts. It would be useful and advantageous in the arts to provide apparatus, systems and methods for protecting relatively low voltage circuit components from large swings in voltage while permitting large voltage swings at the output of a circuit.

SUMMARY OF THE INVENTION

In general, the present invention provides novel apparatus, methods and systems for protecting circuit components in a circuit having large voltage swings. More specifically, the invention protects individual transistors from voltage swings higher than their maximum capacity in circuits capable of sustaining voltage swings higher than the maximum capacity of the individual transistors by providing a protective subcircuit adjustable in response to the output voltage.

According to one aspect of the invention, a method for providing excess voltage protection in a circuit having a voltage swing greater than the voltage capacity of the circuit output transistor includes the step of maintaining the gate-to-source voltage of a protection transistor in a range from approximately zero to the maximum allowable gate-to-source voltage. A further step includes maintaining the drain-to-source voltage of the protection transistor in a range from approximately zero Volts to the maximum allowable drain-to-source voltage. In a further step, the drain-to-source voltage of the circuit output transistor is maintained below its maximum.

According to a further aspect of the invention, a step of adjusting the protection transistor gate-to-source voltage in response to the circuit output voltage is provided.

According to an additional aspect of the invention, a system for providing circuit voltage swing capacity in excess of the maximum voltage swing capacity of individual circuit components is provided. The system includes a circuit having an output transistor for controlling circuit output. A protection transistor is provided for protecting the output transistor from excessive drain-to-source voltage. A follower section is provided for protecting the protection transistor from excessive gate-to-source voltage and for preventing excessive drain-to-source voltage at the protection transistor. A biasing section is used for providing bias current to the follower section responsive to circuit output voltage.

In a preferred embodiment of the invention, a protection transistor is implemented using PMOS, and a follower section transistor is implemented using NMOS.

According to yet another aspect of the invention, apparatus for protecting a circuit from excessive voltage is provided. A protection section is operably coupled to an output transistor of the circuit and an adjustable follower section. The adjustable follower section includes a follower transistor coupled to the protection transistor for adjusting the bias of the protection transistor in response to changes in circuit output voltage. A biasing section is coupled to the follower section for supplying bias current to the follower transistor.

According to still another aspect of the invention, a preferred embodiment implements the apparatus of the invention using PMOS transistors for output and protection transistors and an NMOS follower transistor.

The invention provides many technical advantages including but not limited to providing a circuit output capable of swinging within a broader voltage range that the maximum drain-to-source voltage of the circuit output transistor. Further advantages are realized in terms of reduced complexity and circuit area. The invention provides additional advantages by introducing a variable protection section biasing scheme, which increases the utility of relatively low voltage components for high voltage applications and increases overall flexibility in terms of component selection in circuit design.

BRIEF DESCRIPTION OF THE DRAWINGS

The above and additional features and advantages of the present invention will be more clearly understood from consideration of the following detailed description in connection with the accompanying drawings in which.

References in the detailed description correspond to like references in the figures unless otherwise noted. Like numerals refer to like parts throughout the various figures. The descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles of the invention.

DETAILED DESCRIPTION OF PREFERRED EMBODIMENTS

In general the invention provides excess voltage protection in a circuit having a voltage swing up to approximately twice the voltage capacity of a circuit output transistor. This is accomplished by maintaining the source-to-drain voltage of a protection transistor below its maximum value while simultaneously maintaining its gate-to-source voltage below its maximum value. Thus, the drain-to-source voltage of the circuit output transistor is guarded from exceeding its maximum acceptable value.

Figure 1:
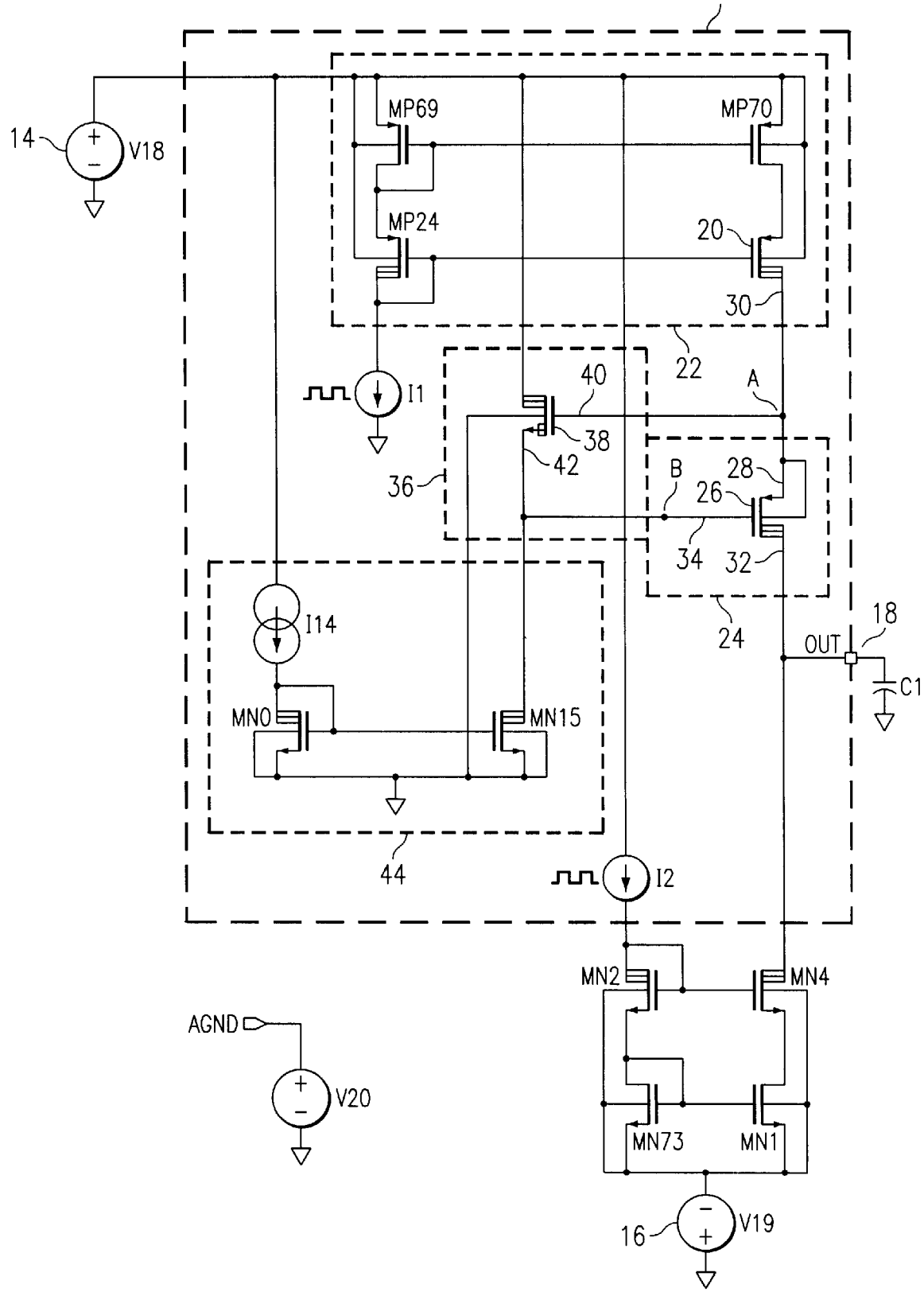
FIG. 1 is a schematic diagram of an example of a preferred embodiment of a system and apparatus of the invention.

Referring now primarily to FIG. 1 a circuit 10 is shown, in this case implemented on a single microchip 12 although other implementations are possible, having a positive input voltage source 14 and a negative input voltage source 16. In this example, the positive voltage source 14 supplies +25 Volts and the negative voltage source 16 is −25 Volts. Of course, these values and the other values shown for the circuit components and described herein are merely examples used in a preferred embodiment of the invention. It will be apparent to those skilled in the arts that different circuit and component values, and even different transistor types, may be used without departure from the principles of the invention. The circuit 10 has an output pin 18 coupled to an output transistor 20. Typically the output transistor 20 is a portion of a cascode configuration 22 known in the arts. In the present example of the apparatus, methods, and system of the invention, the circuit 10 is designed to accommodate a voltage swing of −25 Volts to +25 Volts. The higher voltage transistors shown in this example of a preferred implementation of the invention have a maximum drain-to-source voltage of about 30 Volts, and a maximum gate-to-source voltage of approximately 15 Volts. Of course, as indicated above, different value components may be used. It should also be understood that, making appropriate modifications for reversing polarity, the invention may be implemented reversing PMOS and NMOS transistors of various selected values and changing the polarity accordingly. Additional modifications are also possible without departing from the invention.

The circuit shown in FIG. 1 includes a protection section 24, in this example, implemented using a PMOS transistor 26. The source terminal 28 of the protection transistor is electrically coupled to the drain terminal 30 of the output transistor 20. The drain terminal 32 of the protection transistor 26 is electrically coupled to the output pin 18. The gate 34 of the protection transistor 26 is coupled to a follower section 36 of the circuit. As shown, the follower may be implemented using an NMOS transistor 38. The gate 40 of the follower transistor 38 is electrically coupled to the source 28 of the protection transistor 26 and to the drain 30 of the output transistor 20. The gate 40 and source 42 of the following transistor 38 are connected in a follower configuration and coupled to the gate 34 of the protection transistor 26. A biasing section 44 of the circuit 10 is provided for generating a bias current for the follower section 36 as known in the arts.

In operation, the output transistor 20 will never be subjected to a drain-to-source voltage higher than its maximum capacity. This is preferably accomplished with the arrangement of the protection transistor 26 and the follower transistor 38 shown in FIG. 1. Node A is incapable of going substantially below ground because node B is also prevented from going below ground. The follower transistor 38 protects the gate-to-source voltage of the protection transistor 26, preventing it from going higher than its maximum allowable gate-to-source voltage, in this example approximately 15 Volts. At the same time, the follower transistor 38 protects the drain-to-source voltage of the protection transistor 26 from exceeding its maximum drain-to-source voltage, in this example 30 Volts. The biasing section 44 generates the appropriate bias for the follower transistor 38, which may be varied according to the particular circuit requirements. Thus, by arrangement of the follower section 36 and protection section 24, the circuit 10 output 18 is permitted to swing from −25 Volts to +25 Volts. The voltage at nodes A and B is permitted to range from about zero Volts to 25 Volts, thereby protecting the circuit 10 components from excessive voltage while providing the circuit 10 with the capability of much larger voltage swings, in this example a difference of about 50 Volts.

Figure 2:
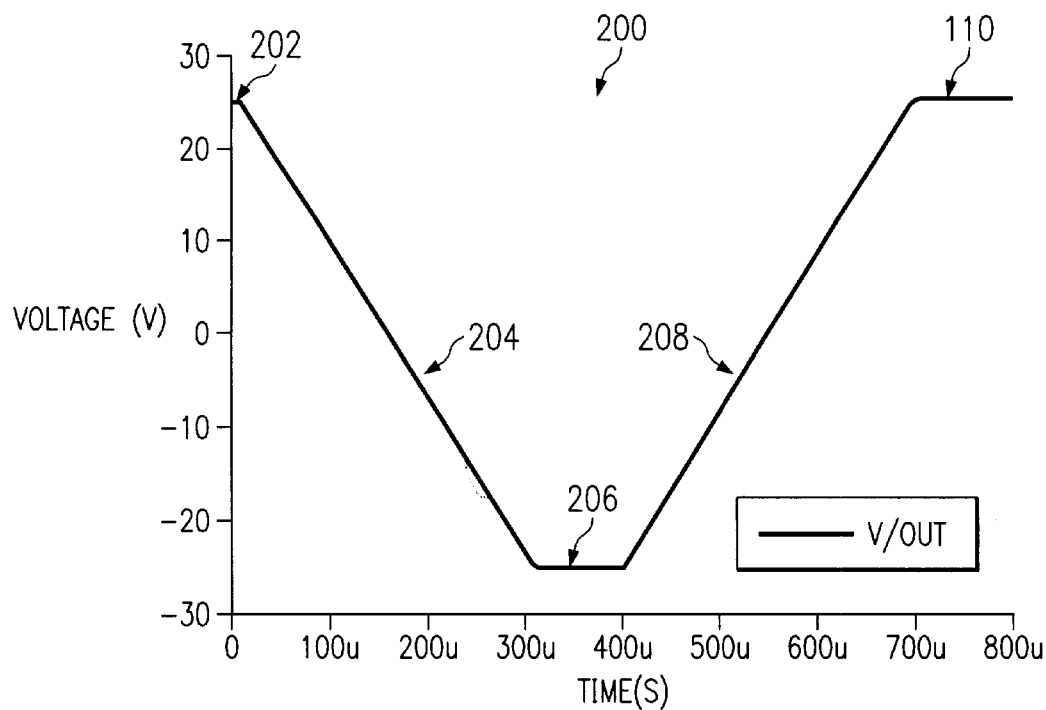
FIG. 2 is a graphical representation of an example of the transient output response of the circuit shown in FIG. 1.

FIG. 2 is a graphical representation of an example of the output response 200 of the circuit of FIG. 1. The voltage is shown on the vertical axis and time is shown on the horizontal axis. As shown for the sake of this example, the circuit (10) has a constant initial output voltage of +25 Volts, 202. Shown in the second segment of the trace 204, the output voltage is made to decrease to −25 Volts. A period 206 of constant −25 voltage ensues, and then the output voltage is linearly increased 208 to +25 Volts 110. Aspects of the circuit (10) during this voltage swing of 50 Volts are discussed below.

Figure 3:
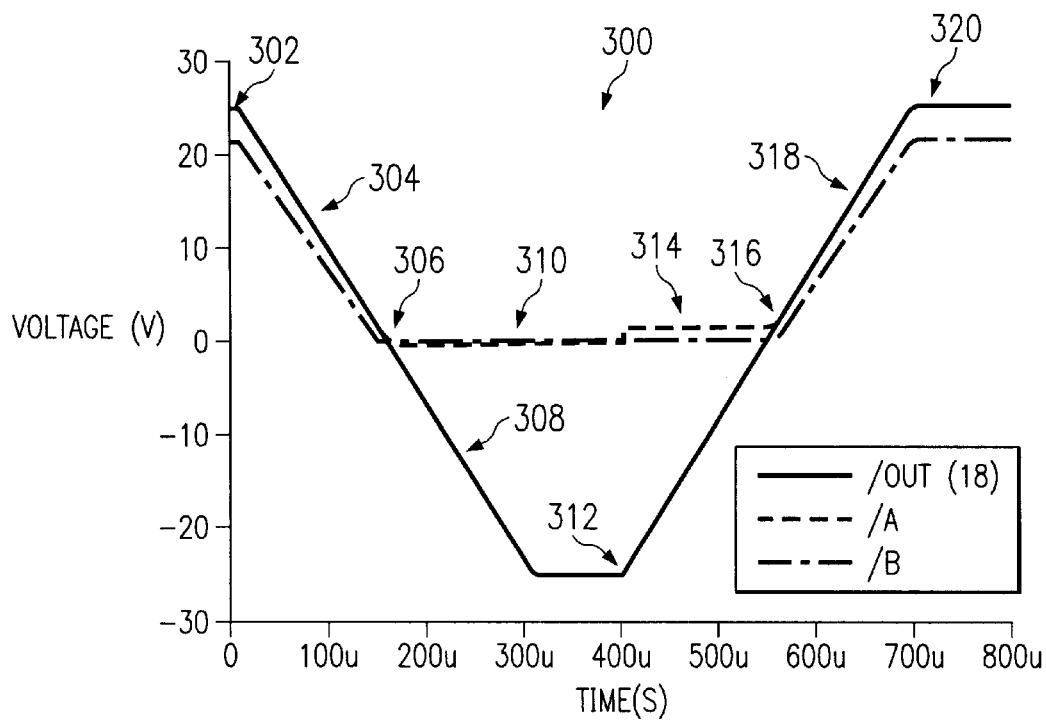
FIG. 3 is a graphical representation of the transient response of the protection section of the system shown in FIG. 1.

FIG. 3 is a graphical representation of the transient response 300 of nodes A and B as well as at the output pin 18 of the circuit example of FIG. 1. The voltage is shown on the vertical axis and time is shown on the horizontal axis. As shown for the sake of this example, the circuit (10) has an initial output voltage of +25 Volts. As seen in the first segment of the trace 302, the output voltage is the same as the voltage at node A. The voltage at node B however, is approximately +3.5 Volts less, representing the turnon voltage of the follower. Note that the difference in voltage between nodes A and B is largely determined by the characteristics of the follower transistor (38, FIG. 1).

It should be understood that in order for the protection transistor 26 to protect the output transistor 20 from excessive drain-to-source voltage, and in order for the protection transistor 26 itself to be protected from excessive gate-to-source voltage, the appropriate relationship between the protection transistor 20 and follower transistor 38 must be maintained. The gate-to-source voltage of the follower transistor 38, when it conducts bias current from the biasing section 44, must be large enough to permit the protection transistor 26 to conduct current flowing from the output transistor 20. Since the gate-to-source voltage of the protection transistor 26 and follower transistor 38 are equal, and since the protection transistor 26 is a PMOS transistor and the follower transistor 38 is an NMOS transistor, either the width/length ratio of the MOS channel (W/L) of the protection transistor 26 must be much larger than that of the follower transistor 38, or the bias current of the follower transistor 38 must be relatively large. Restrictions are placed on these parameters by the need to keep the gate-to-source voltage of the follower transistor 38 within physical limitations dictated by the fabrication process, impacting on minimum W/L and/or maximum bias current. Those skilled in the arts will perceive the balance required in the choice of complementary protection section 24 and follower section 36 components relative to the application requirements.

Again referring to FIG. 3, the output voltage remains constant briefly 302, thereafter 304, the output voltage begins to decrease and the voltages at nodes A and B follow in approximate correspondence until the output voltage reaches zero Volts 306. While the output voltage continues to decrease below zero Volts to approximately −25 Volts in this example 308, nodes A and B remain approximately at ground 310. Note that node A can in fact go slightly below ground due to transient conditions. In the present example, at about 400 microseconds, as shown on the horizontal axis 312, the output voltage begins to increase. Accordingly, voltage begins to build up on node A 314. As the output voltage again crosses the zero threshold and becomes positive 316, the voltage at node A is allowed to continue to rise, and the voltage at node B rises at a substantially parallel but slightly lower level 318 until the output voltage again steadies at +25 Volts 320. It should be understood that the voltage on node A goes only slightly below ground, such that the drain-to-source voltage (VDS) of the output transistor 20 is kept safely within the limit of 30 Volts maximum. Additionally, the voltage difference between node A and the output node (VDS of the protection transistor 26) never exceeds 30 Volts.

Figure 4:
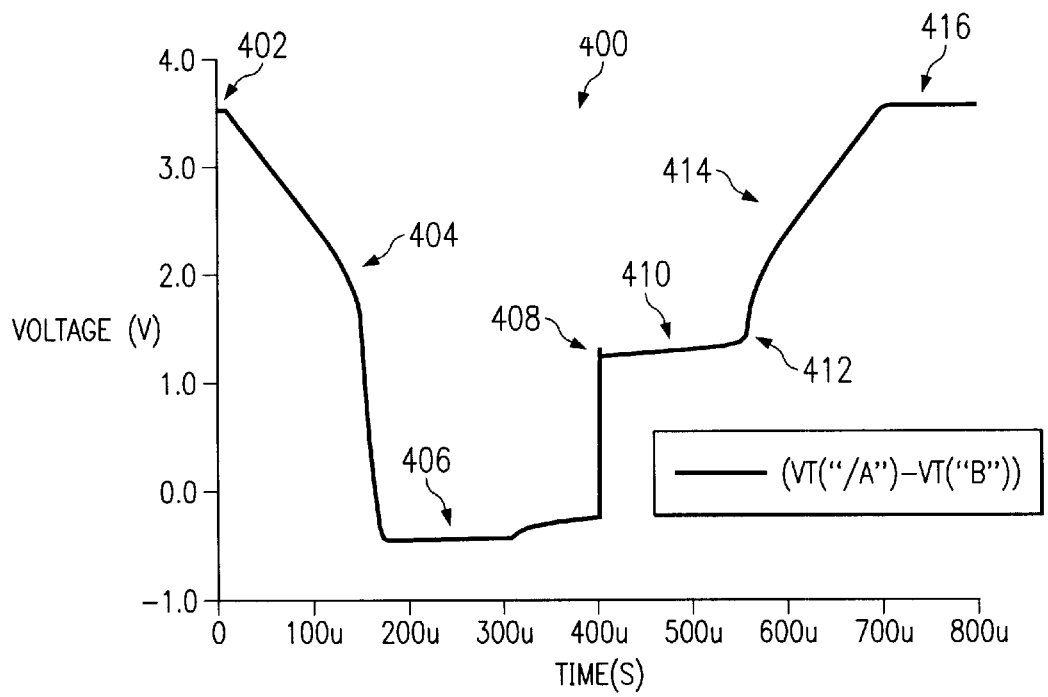
FIG. 4 is a graphical representation of the transient response of the gate-to-source voltage of the protection transistor of FIG. 1.

A greater understanding of the invention may be facilitated by reference to FIG. 4, a graphical representation of the gate-to-source voltage of the protection transistor 26 shown in FIG. 1. Voltage is represented on the vertical axis, and time is represented on the horizontal axis on a scale corresponding to that of FIG. 2. As can be seen by the trace 400 depicted in FIG. 4, the gate-to-source voltage of the protection transistor never rises above about 3.52 Volts. After an initial constant period 402 at about 3.52 Volts, the gate-to-source voltage of the protection transistor drops 404 along with the voltage at nodes A and B. As indicated by the next segment of the trace 406, the gate-to-source of voltage of the protection transistor remains at slightly below ground until the output voltage begins to increase at about 400 microseconds, at which time 408 the gate of the protection transistor begins to receive positive voltage gradually increasing 410 until the point 412 where the output voltage becomes positive at about 570 microseconds, where the increase 414 is more rapid until a maximum of about 3.52 Volts is again reached 416. As can be seen by FIG. 4, the gate-to-source voltage of the protection transistor is never in danger of exceeding its maximum value, in this example about 15V, as the drain-to-source voltage at the output transistor is allowed to approach, but never exceed, its maximum value.

Figure 5:
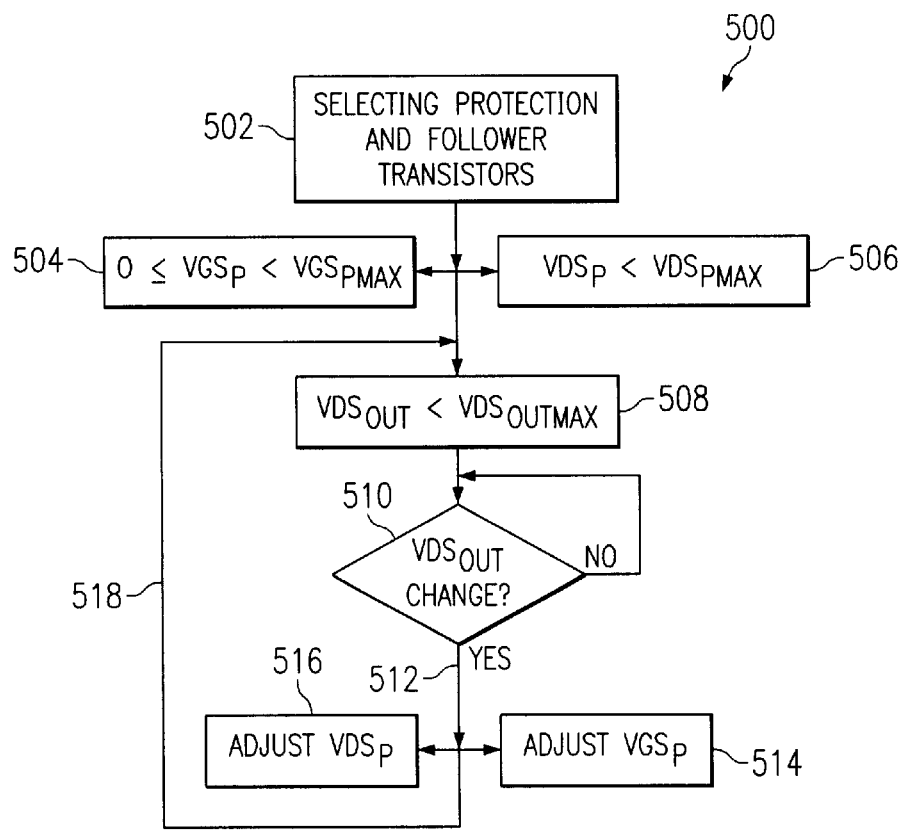
FIG. 5 is a process flow diagram illustrating the steps in an example of a preferred embodiment of the invention.

FIG. 5 offers an alternative view of the methods of the invention, with a process flow diagram illustrating the steps for implementing a preferred method of the invention. Within a circuit with an output voltage swing larger than the voltage capacity of the circuit output transistor, excessive voltage at the output transistor is prevented 500, by the step 502 of selecting a protection transistor and a follower transistor adapted to maintain a complimentary balance between gate-to-source voltage and source-to-drain voltage as described above.

In the present example, the protection transistor and a follower transistor are chosen such that the have a maximum gate-to-source voltage and maximum source-to-drain voltage approximately one-half of the voltage swing of the circuit. Typically, less than one-half the anticipated voltage swing value may be used to allow for a safety margin dictated by the particular application. Preferably, the voltage swing protection doubles the application voltage. As shown at step 504, the gate-to-source voltage of the protection transistor is kept within a range from approximately zero to the maximum allowable gate-to-source voltage (VGSmax). Simultaneously, the source-to-drain voltage of the protection transistor is maintained in a range from approximately zero to the maximum allowable drain-to-source voltage (VDSmax), step 506. The protection transistor is used to ensure that the drain-to-source voltage of the circuit output transistor below its VDSmax, step 508. As shown by decision diamond 510, responsive to changes in the drain-to-source voltage of the output transistor, indicated by the arrow path 512, preferably by using the relationship between the protection transistor and follower transistor, the protection transistor gate-to-source voltage is adjusted in response to changes in the circuit voltage, 514. As shown at step 516, the protection transistor drain-to-source voltage is preferably adjusted in response to changes in the circuit output voltage as well. In this way, as indicated by arrow path 518, the responsive adjustments of the voltages at the protection section of the circuit are able to maintain the correct voltage at the output transistor.

Thus, the invention provides circuit protection from excessive voltage while permitting the circuit output to experience large voltage swings. The output-responsive adjustment of the protection section permits the maintenance of the output transistor drain-to-source voltage well within acceptable operating levels while the following section simultaneously prevents damage to the protection section. The circuit configurations, component selection, and techniques illustrated by example herein facilitate the use of relatively low voltage components in a circuit subjected to high voltage swings. The invention provides many advantages including providing increased utility for low voltage circuit components and extending the possibilities for processes producing circuits from low-voltage components. While the invention has been described with reference to illustrative embodiments, this description is not intended to be construed in a limiting sense. For example, even though the exemplary embodiment has been shown for an application using MOS transistors, the invention may alternatively be implemented in a similar application using bipolar transistors. In such a case, instead of protection the drain-to-source VDS of a MOS device, excess voltage protection would be provided at the collector-emitter (VCE) of a bipolar transistor, facilitating the use of a low VCE voltage bipolar transistor in an application requiring a relatively high voltage swing at the output. Various modifications and combinations of the illustrative embodiments as well as other embodiments of the invention will be apparent to persons skilled in the art upon reference to the description and claims.

I claim:

1. Apparatus for protecting a circuit from excessive voltage comprising:
   a protection section operably coupled to an output node of the circuit;
   a follower section responsive to circuit output voltage operably coupled to the protection section for adjusting the bias of the protection section and for protecting the protection section from excessive drain-to-source voltage; and
   a biasing section operably coupled to the follower section for supplying a bias current to the follower section.

2. Apparatus according to claim 1 wherein the protection section further comprises a PMOS transistor.

3. Apparatus according to claim 1 wherein the follower section further comprises an NMOS transistor.

4. Apparatus according to claim 1 wherein the protection section further comprises an NMOS transistor.

5. Apparatus according to claim 1 wherein the follower section further comprises a PMOS transistor.

6. A system for providing circuit voltage output swing capacity in excess of the maximum voltage swing capacity of individual circuit components comprising:

an output transistor for controlling circuit output;

a protection transistor operably coupled to the output transistor for protecting the output transistor from excessive drain-to-source voltage;

a follower transistor responsive to circuit output voltage operably coupled to the protection transistor for protecting the protection transistor from excessive drain-to-source voltage and for protecting the protection transistor from excessive gate-to-source voltage; and a biasing section for generating bias current for controlling the following transistor responsive to circuit voltage output swing.

7. A system according to claim 6 wherein the output transistor comprises a portion of a circuit section arranged in a cascode configuration.

8. A system according to claim 6 wherein the protection section further comprises a PMOS transistor.

9. A system according to claim 6 wherein the follower section further comprises an NMOS transistor.

10. A system according to claim 6 wherein the protection section further comprises an NMOS transistor.

11. A system according to claim 6 wherein the follower section further comprises a PMOS transistor.

12. A method for providing excess voltage protection in a circuit having an output voltage swing larger than the maximum voltage capacity of a circuit output transistor, comprising the steps of:

maintaining the gate-to-source voltage of a protection transistor in a range from approximately zero to its maximum gate-to-source voltage value;

maintaining the source-to-drain voltage of a protection transistor in a range from approximately zero to its maximum drain-to-source voltage value; and using the protection transistor for maintaining the drain-to-source voltage of the circuit output transistor below its maximum drain-to-source voltage value.

13. The method according to claim 12 further comprising the step of maintaining the gate-to-source voltage of the protection transistor in a range from approximately zero to its maximum gate-to-source voltage value responsive to changes in the circuit output voltage.

14. The method according to claim 12 further comprising the step of maintaining the source-to-drain voltage of the protection transistor in a range from approximately zero to its maximum drain-to-source voltage value responsive to changes in the circuit output voltage.

15. The method according to claim 12 further comprising the step of using the protection transistor for maintaining the drain-to-source voltage of the circuit output transistor below its maximum drain-to-source voltage value responsive to changes in the circuit output voltage.

16. The method according to claim 12 further comprising the step of using a follower transistor to maintain the protection transistor drain-to-source voltage and gate-to-source voltage below their maximum values.

17. The method according to claim 16 further comprising the step of selecting the protection transistor and follower transistor with a relationship of physical characteristics adapted to maintain the protection transistor gate-to-source voltage and source-to-drain voltage below maximum values.

18. The method according to claim 16 further comprising the step of selecting a PMOS as the protection transistor.

19. The method according to claim 16 further comprising the step of selecting an NMOS as the follower transistor.

20. The method according to claim 16 further comprising the step of selecting an NMOS as the protection transistor.

21. The method according to claim 16 further comprising the step of selecting a PMOS as the follower transistor.

22. The method according to claim 11 further comprising the step of configuring the output transistor as a portion of a cascode topology.

* * * * *